(12) United States Patent
Fournel et al.

(10) Patent No.: US 7,494,897 B2
(45) Date of Patent: Feb. 24, 2009

(54) METHOD OF PRODUCING MIXED SUBSTRATES AND STRUCTURE THUS OBTAINED

(75) Inventors: Franck Fournel, Moirans (FR); Hubert Moriceau, Saint-Egreve (FR); Bernard Aspar, Rives (FR); Marc Zussy, Grenoble (FR)

(73) Assignee: Commissariat a l'Energie Atomique, Paris (FR)

( * ) Notice: Subject to any disclaimer, the term of this patent is extended or adjusted under 35 U.S.C. 154(b) by 49 days.

(21) Appl. No.: 10/540,303

(22) PCT Filed: Dec. 22, 2003

(86) PCT No.: PCT/FR03/03867

§ 371 (c)(1),
(2), (4) Date: Feb. 3, 2006

(87) PCT Pub. No.: WO2004/059711

PCT Pub. Date: Jul. 15, 2004

(65) Prior Publication Data

US 2006/0166461 A1      Jul. 27, 2006

(30) Foreign Application Priority Data

Dec. 24, 2002 (FR) .................................. 02 16646

(51) Int. Cl.
*H01L 21/30* (2006.01)
(52) U.S. Cl. ....................... 438/455; 438/458; 438/459; 257/E21.499
(58) Field of Classification Search ................ 438/455, 438/458, 459
See application file for complete search history.

(56) References Cited

U.S. PATENT DOCUMENTS 4,920,396 A     4/1990   Shinohara et al.

(Continued)

FOREIGN PATENT DOCUMENTS

EP           0 889 509 A2     1/1999

(Continued)

OTHER PUBLICATIONS

K.Y. Ahn et al., "Growth, Shrinkage, And Stability Of Interfacial Oxide Layers Between Directly Bonded Silicon Wafers," published In Applied Physics A, 50, 1990, pp. 85-94).

(Continued)

*Primary Examiner*—Hsien-ming Lee
(74) *Attorney, Agent, or Firm*—Brinks Hofer Gilson & Lione

(57) ABSTRACT

The inventive method includes a preparation step during which the substrate is covered with a layer, a pressing step in which a mould including a pattern of recesses and protrusions is pressed into part of the thickness of the aforementioned layer, at least one etching step in which the layer is etched until parts of the surface of the substrate have been stripped, and a substrate etching step whereby the substrate is etched using an etching pattern which is defined from the mould pattern. The preparation step includes a sub-step consisting of the formation of a lower sub-layer of curable material, a step involving the curing of said layer and a sub-step including the formation of an outer sub-layer which is adjacent to the cured sub-layer. Moreover, during the pressing step, the above-mentioned protrusions in the mould penetrate the outer sub-layer until contact is reached with the cured sub-layer.

31 Claims, 6 Drawing Sheets

U.S. PATENT DOCUMENTS

| | | | |
|---|---|---|---|
| 5,138,422 | A | 8/1992 | Fujii et al. |
| 5,661,316 | A | 8/1997 | Kish, Jr. et al. |
| 6,013,954 | A | 1/2000 | Hamajima |
| 6,096,433 | A | 8/2000 | Kikuchi et al. |
| 2001/0007367 | A1 | 7/2001 | Ohkubo |
| 2007/0202660 | A1* | 8/2007 | Moriceau et al. ............ 438/424 |
| 2007/0259528 | A1* | 11/2007 | Moriceau et al. ............ 438/702 |

FOREIGN PATENT DOCUMENTS

FR     2 819 099 A1     12/2000

OTHER PUBLICATIONS

D.M. Garnier et al., "The Fabrication Of A Partial Soi Substrate," Proceedings Of The 9th International Symposium On Silicon On Isolator Technology And Devices, 1999, vol. 99, Ch. 54, pp. 73-78.

A. Laporte et al., "Charged Defects At The Interface Between Directly Bonded Silicon Wafers."

T.Y. Tan et al., "On Oxygen Precipitation Retardation/Recovery Phenomena, Nucleation Incubation Phenomena, And The Exigent-Accommodation-Volume Factor Of Precipitation," Proceedings Of The Fifth International Symposium On Silicon Materials Science And Technology; Semiconductor Silicon 198 Electrochem, Soc, Pennington, Nj, USA; 1986, pp. 864-873).

K. Terada et al., "A New Dram Cell With A Transistor On A Lateral Epitaxial Silicon Layer (Tole Cell)," published In IEEE Transactions On Electron Device, vol. 37, N° 9, Sep. 1990, pp. 2052-2057.

H. Yamaguchi et al, "Intelligent Power IC With Partial Soi Structure," published In Jpn, J. Appl. Phys. vol. 34 (1995), pp. 864-868.

* cited by examiner

METHOD OF PRODUCING MIXED SUBSTRATES AND STRUCTURE THUS OBTAINED

TECHNICAL FIELD

The invention relates to a method of producing mixed substrates, that is substrates in which microelectronic components with a buried layer and components with no buried layer may both be produced; this buried layer may be insulative, but it may also be a question of producing optical components (for example of the MOEMS type) or a microsystem on substrates having both bulk portions (by "bulk" is meant having crystalline and/or electrical continuity) and portions having a buried layer.

BACKGROUND

Electronic components are generally produced on wafers of semiconductor materials such as silicon, for example.

There are several types of electronic component, corresponding to several types of application, for example power components, on the one hand, and logic or control components, on the other hand. These components may be produced on different wafers, for example bulk wafers, on the one hand, and wafers with a buried insulative layer, on the other hand; the latter are sometimes referred to as silicon on insulator (SOI) wafers when the material of which they are constituted is silicon.

"Bulk" wafers have the particular benefit of enabling the production of so-called vertical components, that is components allowing electrical conduction between the front and rear faces of the wafer. On the other hand, SOI wafers enable the production of components that are totally insulated from each other and from their substrate; this type of wafer is also very widely used to produce MEMS and MOEMS components.

The only example of a material constituting wafers referred to hereinafter is silicon and the only example of a buried layer referred to hereinafter is that of a layer of the relevant oxide (and thus an insulative layer), but it must be understood that other materials, in practice other semiconductor materials, may be used, in particular InP, AsGa, Ge, $Si_xGe_{1-x}$, $LiNbO_3$, III-V compounds, II-VI compounds, SiC, diamond, sapphire, and piezoelectric and pyroelectric materials, and that other buried layers are possible.

Moreover, the expression "bulk wafer", which in the examples to be given hereinafter designates a wafer of a single material, must be understood more generally as being liable to designate a wafer of one or more materials with no buried layer (a fortiori with no insulative buried layer), for example a substrate of silicon under a layer of germanium.

It may be noted that using SOI wafers, the production of which is a proven technology, may be beneficial even if it is unnecessary for the buried layer to be insulative.

It is becoming important to integrate different components into a small volume in order to obtain advanced functions. For many applications, combining components produced on a bulk material with components produced on an SOI material has many advantages, since it enables in particular the production of power components with their logic circuits or with sensors, etc.

One way to combine these different component types is to produce them on the same wafer, which is possible using wafers consisting in part of bulk regions and in part of SOI regions.

Mixed wafers or mixed substrates of this kind have many advantages, including:

they enable the production of both components that are totally insulated from each other and components that function vertically, that is they enable electrical conduction across the volume of certain regions of the wafer, and they enable different types of function to be produced independently on the same wafer: electrical and/or mechanical and/or optical.

Various methods of fabricating mixed substrates of this kind are described in the following documents in particular:

U.S. Pat. No. 6,096,433 (NEC Corp), which aims to eliminate the drawbacks of a prior art solution whereby a laminated substrate (that is a substrate comprising a stack of layers) is fabricated from two semiconductor wafers bonded together, one of which has insulative (oxide) regions from place to place on its surface. To prevent the appearance of voids at the interface between the two faces (caused by the different surface state of the Si and $SiO_2$ regions and steps between the two materials), the above document proposes to set the free face of the oxide back relative to the surrounding free face of the silicon, so that there is very good adhesion between the two wafers (in Si and Si regions).

The paper "A new DRAM cell with a transistor on a lateral epitaxial silicon layer (TOLE cell)" by K. TERADA, T. ISHIJIMA, T. KUBOTA and M. SAKAO, published in IEEE Transactions on Electron Device, Vol. 37, No. 9, September 1990, pp. 2052-7, which proposes lateral epitaxy of silicon to produce a mixed SOI.

The paper "Intelligent Power IC with partial SOI Structure" by H. YAMAGUCHI, H. HIMI, S. FUJINO and T. HATTORI published in Jpn, J. Appl. Phys. Vol. 34 (1995), pp. 864-868, which proposes etching one of the faces of the wafers to form the future assembly, bonding the two faces, and then filling the cavities formed at the interface in this way with oxide.

All the above methods use molecular bonding with Si/Si junction regions.

In practice, these Si/Si interfaces should ideally not induce any disturbance in the future components that will utilize these junctions. In particular, it has proved important to be able to minimize impurities in the "bulk" regions, in particular precipitates of oxides, which in particular constitute charge traps that may interfere with good electrical conduction between the two wafers, and the quantity of dislocations caused by misalignment between the two crystals of silicon, which among other things impedes vertical conduction. The above documents do not teach how to guarantee good quality at this interface.

Another type of method is described in the paper "The Fabrication of a Partial SOI Substrate" by D. M. GARNIER, G. ENSELL, J. BONAR, A. BLACKBURN, F. UDREA, H. T. LIM, A. POPESCU, P. L. F. HEMMENT and W. I. MILNE, Proceedings of the 9th International Symposium on Silicon On Isolator Technology and Devices, 1999, Vol. 99, Ch. 54, pp. 73-78, which proposes to create an insulative buried layer having a predetermined pattern, with windows filled with silicon; however, this is not a mixed substrate obtained by molecular bonding, since it is recommended to start with a SIMOX wafer (preferably two wafers bonded together) that is attacked locally through the silicon as far as through the oxide insulative layer; silicon is then grown epitaxially in the windows formed in this way; there is no interface produced by molecular bonding; the above document therefore provides no solution to the problem stated above of producing an interface of good quality.

SUMMARY

An object of the invention is a method of fabricating a mixed substrate in the sense defined hereinabove that guarantees that an interface of good quality is obtained, at least electrical in the case of microelectronic components, in bulk regions, in particular of the Si/Si type.

The invention also consists in a mixed substrate or a structure having an interface of the above kind of good quality.

To this end the invention proposes a method of fabricating a mixed substrate whereby:

- two substrates are prepared having respective faces adapted to be bonded together and consisting essentially at these faces of crystalline portions and, on at least one of these two faces, regions formed of a material different from those constituting the crystalline portions,
- these faces are offered up face-to-face and are joined at an interface by molecular bonding to form bulk regions, in which the facing faces are essentially crystalline, and stacked regions, in which at least one of the facing faces essentially consists of a different material, and
- heat treatment is effected to consolidate the bonding,
- characterized in that, during the preparation of the substrates or during the joining of the faces, impurity traps are created at said interface such that any portion of that interface forming part of a bulk region is at most at a given distance from a trap, while the faces are offered up face-to-face with a misalignment between the crystalline portions of these two substrates below a given threshold.

It may be a question of two crystals, each made from a semiconductor material, for example, advantageously obtained from the same original crystal (see below).

The traps are preferably buried layers, such as localized oxide layers, and the regions formed of a different material are preferably electrically insulative regions or localized oxide layers.

It may be noted that the crystalline portions are flush with or at least very close to the faces (there may be a native oxide layer up to approximately 20 Angstroms thick).

The stacked regions are often insulated regions.

It will be noted that, for simplicity, the expression "bulk region" may be used to designate the region in which the future bulk region will be situated, in particular, even if the crystalline contact has not yet been produced.

Thus the invention proposes to comply with good alignment of the crystalline orientations between the two connected crystalline portions and to distribute traps within (or in the vicinity of) bulk regions so as to have an Si/Si interface (if both substrates or wafers are of silicon) that is compatible with the production of components in this bulk region. These traps absorb the various impurities present on the surfaces of the bonded faces, in particular oxide precipitates generated during the molecular bonding process.

To this end, the invention further consists in a method of producing a mixed substrate formed by assembling two substrates having crystalline portions of a material guaranteeing very good crystallographic alignment of these crystalline portions at the moment of their assembly, by molecular bonding or by any other method of connection liable to benefit from good crystallographic continuity.

U.S. Pat. No. 5,661,316 (HEWLETT-PACKARD Company) teaches minimizing the crystalline misorientations between two crystals joined by hydrophobic bonding in order to produce a good ohmic interface, but there is no disclosure of producing in these crystals insulated regions or traps (which are necessarily defects at this interface). Similar comments apply to the paper "Charged Defects at the Interface between Directly Bonded Silicon Wafers" by A. LAPORTE, G. SARRABAYROUSE, M. BENAMARA, A. CLAVERIE, A. ROCHER and A. PEYRE-LAVIGNE. The above documents are more particularly concerned with hydrophobic Si/Si bonding.

It is also known in the art that, in the case of hydrophilic bonding, if the two silicon substrates are bonded with a very thin (<2 nm) layer of native oxide on their surface, and if the crystals are sufficiently well aligned (<1° in rotation and <1° in bending), the oxide film may disappear during heat treatment to stabilize the bond (see "Growth, Shrinkage, and Stability of Interfacial Oxide Layers between Directly Bonded Silicon Wafers" by K. Y. AHN, R. STENGL, T. Y. TAN, U. GOSELE and P. SMITH published in Applied Physics A, 50, 1990, pp. 85-94). However, this paper does not disclose how to obtain an interface with no silicon oxide precipitates when two native oxide layers are bonded hydrophilically. In any event, the above document does not concern itself with a mixed substrate having an interface comprising a well-defined layer of oxide in certain regions and no oxide layer in other regions.

Finally, it is known in the art that, in the case of heat treatment, below a certain critical radius that depends on the thermal budget, small oxide precipitates are dissolved to the benefit of larger precipitates within the bulk silicon (see "On Oxygen Precipitation Retardation/Recovery Phenomena, Nucleation Incubation Phenomena, and the Exigent-Accommodation-Volume factor of precipitation" by T. Y. TAN, C. Y. KUNG, Proceedings of the Fifth International Symposium on Silicon Materials Science and Technology; Semiconductor Silicon 198 Electrochem, Soc, Pennington, N.J., USA; 1986, pp. 864-73). However, no conclusions are drawn from this as to the production of an interface having to include a well-defined buried layer, in particular oxide layer, in certain regions only.

The traps that the invention recommends providing may be oxide regions enclosed at the time of molecular bonding during the fabrication of the mixed substrate.

These traps may advantageously be the regions of different material, for example the regions of oxides defining SOI insulated regions, when those regions are distributed in the wafers so as not to be far from the various portions of the bulk regions (this depends on the configuration selected for the bulk or insulated regions) to be able to serve as traps and to enable Si/Si bonding to be obtained without precipitates or impurities at the bonding interface.

The given maximum distance between any portion of the bulk regions and a trap, and thus the maximum spacing between traps, is a function of the type of surface preparation of each of the faces, the temperature of the heat treatments for stabilizing molecular bonding and the crystalline misalignment between the two crystalline portions.

In the case of hydrophilic bonding, for example, where the two crystalline portions are aligned to better than 1° in rotation and whose misalignment in bending (also known as "miscut") does not exceed 1°, if the SOI regions and the regions of oxide deposited intentionally are sufficiently close to each other, the oxide precipitates formed during the disappearance of the native oxide film on one of the surfaces will be able, as a function of the thermal budget (temperature and time), to migrate toward the adjoining oxide layer regions, which may here be considered as very large precipitates that will attract the smaller precipitates in their vicinity. The range of this attraction depends not only on the thermal budget but also on the density of the natural oxide traps formed by the dislocations, which density depends on the misalignment. This mechanism is reinforced by the localization of the traps and the precipitates created by the cementing at the bonding interface.

In the case of hydrophobic bonding it is possible, by adapting the surface of the bulk regions, to obtain an interface without precipitates, even if a significant misorientation angle (intentional or otherwise) is authorized between the two crystals, that is an angle greater than the maximum angle authorized in the documents cited above for bonding two silicon wafers with no buried oxide layer. This eliminates the need for checking the crystalline misorientation angles at the time of hydrophobic bonding, or at least allows for less precise checking, which has the advantage of simplifying the fabrication process.

Moreover, it may be beneficial to create an array of dislocations, for example for the growth of nanostructures. It is then beneficial, during the fabrication of the bulk regions, to impose a misalignment between the two crystalline portions. For example, a misalignment of approximately 6° in rotation and approximately 1° in bending may be imposed. According to the paper "Growth, Shrinkage . . . " cited above, this angle of 6° cannot produce an interface with no oxide precipitate. However, thanks to the presence, in accordance with the invention, of traps, it becomes possible to obtain an interface with no precipitates with a misalignment of this magnitude.

The very existence of the bonding interface is an advantage here because, as an interface, it enables easier diffusion of impurities from the bulk regions to the traps.

It is important to note that this attraction is not limited to the oxygen precipitates and may operate on other contaminants such as carbon, or other impurities present at or near the surface when contact occurs during bonding.

From a quantitative point of view, the maximum distance that any portion of the bulk region must be from a trap is of the order of a few millimeters.

A distance of the order of one millimeter would appear to be appropriate for most materials, including silicon.

As indicated above, the traps that the invention provides may consist of regions of oxide layer forming part of SOI regions and therefore situated in the vicinity of the bulk regions. No other trap may be necessary if the distribution of the bulk regions and the insulated regions is such that all portions of the bulk regions are at more than the specified distance from an insulated region, which corresponds in practice to a specific arrangement of the wafers because, since the production of mixed substrates was first proposed, the bulk regions have generally been very large, and usually in the central portion of the wafers; in other words, if the choice is made not to add traps to the interior of the interface of the bulk regions, the invention implies modifying the distribution of the bulk and insulated regions compared to what is known in the art in the case of mixed substrates.

If the configuration of the bulk regions and the insulated regions does not satisfy the condition cited above, the invention teaches adding traps in the interface of the bulk regions; note that it might seem paradoxical to teach the provision of defects in an interface whose quality is to be optimized; however, it has become apparent that, if the oxide layers within the interface of the bulk regions are sufficiently small, they serve as efficient traps without impeding electrical conduction. By sufficiently small is meant an area of a few square nanometers.

The location of the traps being known and precise, the geometry of the components within the bulk regions is adapted accordingly to avoid any problem.

Thus, according to preferred features of the invention, which may advantageously be combined:

- the regions formed of a different material and the traps are localized oxide layers.
- the regions formed of a different material and the traps may have different thicknesses and be in contact or not.
- the localized oxide layers have a thickness from a few nanometers to a few millimeters, for example from approximately 0.01 microns to approximately 3 microns.
- the localized oxide layers have a rectangular shape, for example, with dimensions from a few tenths or hundredths of a micron and a few millimeters (depending on whether they form traps or not).
- the localized oxide layers are prepared by thermal oxidation through a mask; alternatively, the localized oxide layers are prepared by deposition through a mask or by etching an oxide layer.
- preparation includes a step of treating the faces to render them hydrophobic; in this case, the given misalignment threshold is preferably ±6° in rotation and ±1° in bending; it is advantageous if one of the faces is etched using a mask with patterns that are not farther apart than the given distance, an oxide layer is then generated on this face (a layer of thermal oxide is deposited or a layer of native oxide is created), the face is planarized to expose (or at least move very close together) the non-etched regions and this face is cleaned to render it hydrophobic.
- preparation includes a step of treating the faces to render them hydrophilic; in this case, the given misalignment threshold is preferably ±1° in rotation and in bending; it is advantageous if one of the faces with an oxide layer is etched using a mask with patterns that are not farther apart than the given distance, an oxide (thermal or native oxide) layer is generated on this face, the face is planarized to expose (or at least move very close together) the non-etched regions of the constituent material of the crystalline portion and this face is cleaned to render it hydrophilic.
- each crystalline portion is made from a material selected from the group comprising Si, InP, AsGa, Ge, compounds of silicon including silicon-germanium, LiNbO3, III-V compounds, SiC, diamond, sapphire, piezoelectric materials, pyroelectric materials; each crystalline portion is preferably of silicon, which has the advantage of using well-known techniques.
  - the heat treatment lasts a few hours at a temperature from 800° C. to 1400° C. and the given distance is of the order of one millimeter.
  - the faces adapted to form the interface are treated by deoxidation with HF and/or heat treated and/or by chemical mechanical polishing and/or by plasma treatment and/or by chemical treatment.
  - a thinning treatment is applied to one of the substrates; for example, one of the substrates is thinned by a chemical mechanical abrasion treatment; alternatively, one of the substrates is thinned by producing a fragile layer and by fracturing this fragile layer (this fragile layer may in particular be produced by ionic implantation to a given depth, for example by implantation of hydrogen ions). Another variant consists in preparing one of the substrates so that it is demountable, with a demountable interface (with a controlled mechanical strength sufficiently low to allow said demounting).

The two substrates, or at least the two crystalline portions, are advantageously prepared by obtaining them from the same source crystal, for example by cutting. Before cutting, positioning marks are made on either side of the cutting plane. The two faces created by cutting are then bonded, the interface being prepared in accordance with the invention and the positioning of these faces being controlled by means of the marks.

It is particularly advantageous if the two crystals are obtained by creating a fragile layer in the source crystal. The positioning marks are made on either side of this fragile layer. Fracture is then caused at this fragile layer to create two free faces and the interface is produced by bringing these faces into contact with said marks aligned, after producing the electrically insulative regions (if this is how the regions of different material have to be produced) and the traps.

This fragile layer is preferably formed by ionic implantation (for example by implantation of hydrogen ions) and the marks are advantageously formed in the thickness of the source crystal on either side of the fragile layer.

Another aspect of the invention proposes a mixed substrate (or structure) including two substrates including an interface obtained by molecular bonding of two faces, these substrates including crystalline portions having on either side of the interface a misalignment error of less than ±6° in rotation and less than ±1° in bending and including at this interface stacked regions including at least one localized region consisting essentially of a material different from those constituting the crystalline portions, and where applicable impurity traps such that any portion of the interface away from the stacked regions is at most at a given distance from a stacked region or a trap.

According to preferred features, advantageously combined, the given distance is of the order of one millimeter, the crystals are of silicon, the traps are buried layers, for example localized oxide layers, and the regions of different material are localized oxide layers or electrically insulative layers.

BRIEF DESCRIPTION OF THE DRAWING

Objects, features and advantages of the invention will emerge from the following description, which is given by way of illustrative and non-limiting example, with reference to the appended drawings, in which:

FIGS. 1 to 34 show several variants of the production of a mixed substrate in which impurity traps are distributed so as to have, in the bulk regions, an interface compatible with the production of bulk components.

Figure 1:
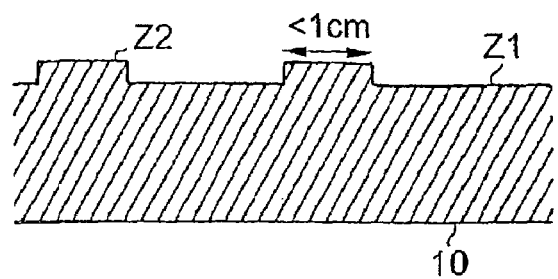
FIGS. 1 to 4 are views in section of a wafer in the course of preparation with a view to fabrication of a mixed substrate.

The process includes the following steps:

A first step consists in producing buried areas, here insulative buried areas, for example of silicon oxide, in at least one of the two starting wafers, here of bulk silicon. To this end a plurality of approaches are possible for producing the oxide and for its accurate placement. With regard to the oxide, it may be either "native" (resulting from natural oxidation of the free surface of the wafers), or obtained by oxidizing some or all of those surfaces or deposited by any appropriate means known in the art. As for its location in precise regions, a certain number of techniques are routinely used in the art, in particular in microelectronics. These techniques are generally founded on the use of a mask during the step of producing the oxide or on the use of delimitation effected separately from this production of the oxide. The distribution of the oxide regions on the surface of one (or both) faces of the future interface between the wafers is selected so that these surfaces will not be too far away from each other in this future interface (this distance being chosen as a function of the thermal budgets to which the wafers will be subjected and the misalignments that will be tolerated during production of the interface).

A second step consists in preparing the surfaces of these wafers, physically (roughness, etc.) and/or chemically (nature of the bonds of surface species, etc.) to obtain good molecular bonding subsequently. A plurality of approaches are possible, with in particular chemical mechanical polishing (CMP) and chemical cleaning methods for obtaining different levels of hydrophilia (hydrophobia) according to whether the interface will be produced locally between the materials of each of the wafers or with an oxide. This step is described in more detail later; it may also include UV ozone and/or plasma treatment.

A third step consists in bringing the prepared faces into intimate contact and causing molecular adhesion of the two wafers; this bringing into intimate contact is achieved by imposing or tolerating crystalline misalignments between the two wafers.

A fourth step consists in effecting a heat treatment to consolidate (or stabilize) the bond, which also favors the trapping mechanisms.

A fifth step that is executed frequently in practice consists in thinning one of the wafers to leave only a film.

There is obtained in this way a mixed substrate comprising an alternation of bulk regions, insulated regions (SOI regions if the wafers are of silicon), and trapping regions, as required, this alternation being selected according to the requirements of the application and the trapping distances to be respected. The residual portion after thinning, when thinning is obtained by fracture along a buried layer, may serve as a starting substrate for a new cycle of fabrication of a substrate, mixed or otherwise. This is known in the art.

Of ways of preparing the surfaces with a view to molecular bonding, the following may be mentioned:

Treatment of the surfaces with HF. On the surface(s) in which oxide regions and raw material regions alternate, it is found that the effect of HF chemical etching is not the same on the oxide and on the raw silicon. The consequence of this is that, upon bringing into contact for bonding, the oxidized areas will have a bonding energy (with a facing region of the bare material, with no oxide) different from those of the regions of bare material, but the global bonding energy is sufficient for good cohesion of the structure.

Heat treatment. Annealing, for example in a hydrogen atmosphere, renders the surfaces of the silicon and the oxide hydrophobic. Other gases may also be used.

Chemical mechanical polishing. This can yield either a hydrophobic state or a hydrophilic state, because the silicon surfaces are not "wetted" after polishing whereas the oxide surfaces are "wetted" after the same kind of polishing. Thus hydrophilic regions and hydrophobic regions are obtained on the same wafer. If that wafer is then offered up face-to-face with regions of the same hydrophilic/hydrophobic nature, the good bonding energy of the hydrophilic regions may be exploited for the oxide portions and hydrophobic bonding for the bare portions, which facilitates the elimination of precipitates, enabling the use of a larger surface without traps, or a greater tolerated or imposed misalignment between the two crystals. The facing wafer may instead be completely hydrophilic or completely hydrophobic, but it is then necessary either to accept a lower bonding energy in certain regions or to provide a native oxide layer at the Si/Si interface, to be eliminated by virtue of a sufficient thermal budget and/or a sufficiently weak misalignment and/or the presence of traps that are sufficiently close together. After chemical mechanical polishing, different cleaning processes may also be used to modify the hydrophilic character of the various regions.

Plasma treatment. The atmosphere selected for the treatment (for example an oxygen-free atmosphere or non-oxidizing atmosphere) controls the surface bonds, thus avoiding bonds that may be the cause of formation of oxides between the two bulk silicon regions; a plasma rich in fluorocarbon is used, for example.

Chemical treatment. Treatment in a chemical solution based on $H_2SO_4/H_2O_2/$ . . . and/or $NH_4OH/H_2O_2$ . . . renders the silicon and oxide surfaces hydrophilic by leaving native oxide on the surface of the silicon regions. Preparation may also include the use of an oxide containing a certain concentration of water, followed by a surface treatment to render the whole of the surface of the wafer concerned hydrophobic, for example chemical treatment with HF and/or heat treatment at low temperature (for example 150° C.) to restore the preferentially hydrophilic nature of the oxide portions with respect to the bare regions.

FIGS. 1 to 7 show a first embodiment of the invention.

A CZ silicon wafer 10 having a resistivity of 14-22 ohm/cm and a diameter of 100 mm is etched using a photolithographic mask with patterns, for example rectangular patterns, that are not more than 1 cm apart and whose depth is of the order of 0.4 micron. These regions have the following dimensions, for example: 1 cm×1 cm.

The etched regions are denoted Z1 and the non-etched regions Z2.

Figure 2:
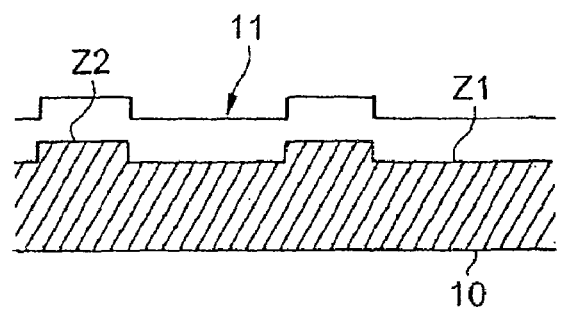
Figure 3:
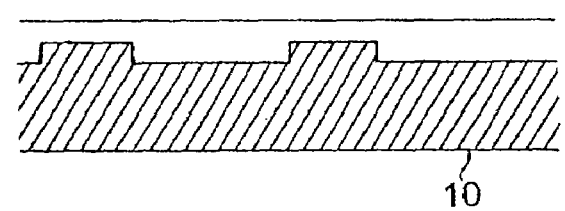
Figure 4:
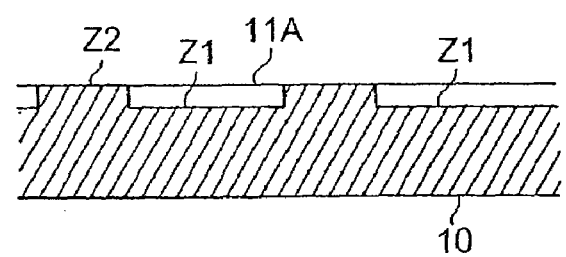

A 0.9 micron thick thermal oxide 11 is then generated over the whole of the surface (FIG. 2). CMP (chemical mechanical polishing, see above) is used to polish this layer very flat to a thickness less than that of the layer 11, for example 0.7 micron (FIG. 3). Accurate elimination is effected by monitoring the thickness to remove all (or practically all) of the thickness of oxide present over the regions Z2 (in fact there remains a thin layer of oxide that will be trapped at the time of the annealing); there remain oxide regions 11A (FIG. 4). This elimination may be effected by wet treatment with HF, for example, or by further CMP treatment and/or hydrogen annealing and/or RIE treatment. The whole surface is then cleaned by heat treatment to render it hydrophobic.

Figure 5:
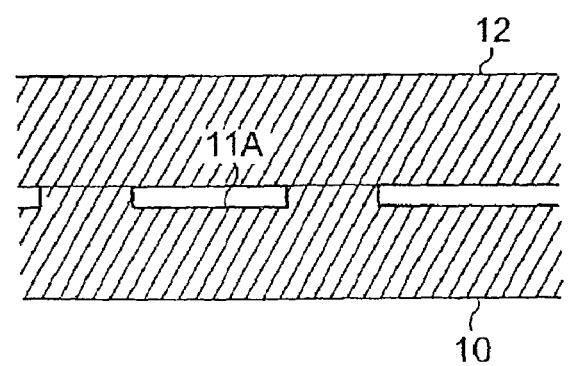
FIGS. 5 to 7 are views in section of this mixed substrate during fabrication from the wafer of FIGS. 1 to 4, FIGS. 8 to 11 are views in section of another wafer in course of preparation with a view to fabrication of a second mixed substrate.

This wafer is then bonded by molecular adhesion to another silicon wafer 12 with no native oxide and whose surface is also hydrophobic (FIG. 5).

During this bonding, a misorientation tolerance of ±1° may be allowed if the wafers have a "miscut" of less than 1° (this is the accuracy of the flats on commercial 100 mm silicon wafers).

This is followed by stabilization annealing at 1300° C. for 3 hours.

Figure 6:
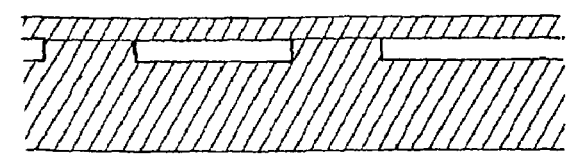
Figure 7:
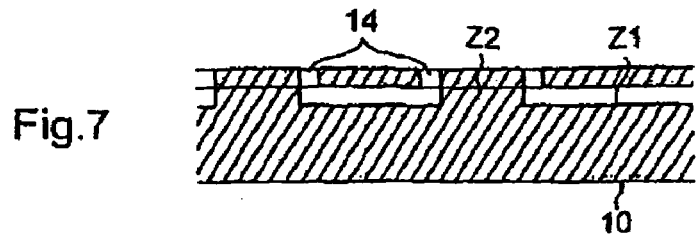
Figure 8:
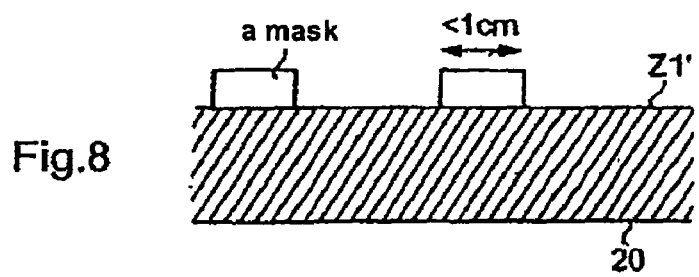
Figure 9:
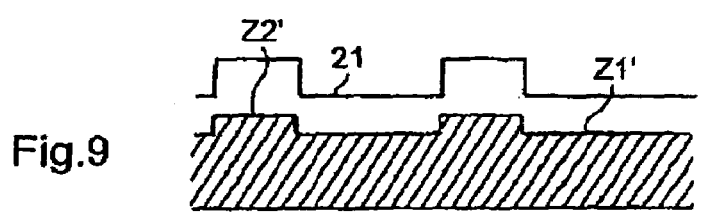

The second wafer 12 is then thinned by mechanical and chemical abrasion, followed by polishing to obtain a mixed substrate including insulated—SOI—regions delimited by the regions Z1 and bulk regions of silicon-silicon contact delimited by the regions Z2 (FIG. 6). These various regions may then be completely insulated from each other by trenches 14 (FIG. 7).

This mixed substrate conforms to the invention in the sense that the insulated regions (each of the oxide regions delimits an insulated region) are sufficiently close together for any portion of the interface region between these insulated regions to be at a sufficient distance (here 1 cm) to guarantee that impurities are trapped at the interface between the oxide regions. Alternatively, only certain oxide regions delimit insulated regions and the others are situated at the level of the interface of a bulk region (this kind of oxide region not delimiting an insulated region is recognized by virtue of the fact that it is not bordered by trenches, for example; it may also be characterized by a size that is substantially smaller than that of the oxide regions contributing to delimiting an oxide region).

FIGS. 8 to 14 show a second embodiment of the invention.

The starting wafer 20 is identical to that from FIGS. 1 to 7, except that its surface is coated with an oxide layer 1 micron thick (not shown). This wafer 20 is etched using a photolithographic mask with rectangular patterns until this oxide layer that is about is completely removed in locations that are not masked. These etched regions are denoted Z1' and the non-etched regions are denoted Z2' (FIG. 8); note that the thermal oxide 21 forms in the silicon region Z'1 whereas it is impeded by the oxide in the region Z'2.

These etched regions are not more than 1 cm apart.

Figure 10:
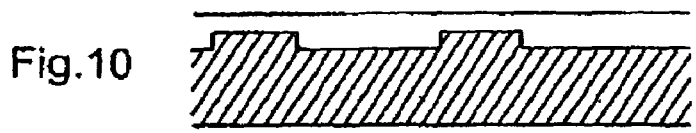

A thermal oxide 21 layer 21 that is about 0.8 micron thick is then formed over the whole of the surface (FIG. 9) and the surface is then planarized by CMP, which entails removing a thickness of 1 micron (FIG. 10).

Figure 11:
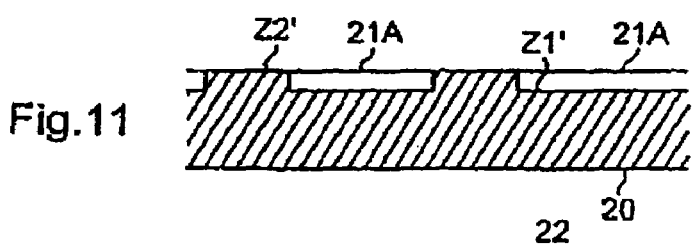
Figure 12:
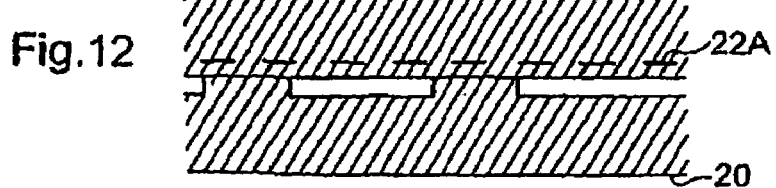
FIGS. 12 to 14 are views in section of this second mixed substrate during fabrication from the wafer of FIGS. 8 to 11, FIGS. 15 to 17 are views in section of the fabrication of two wafers intended for the fabrication of a mixed substrate of the type shown in FIGS. 5 to 7, FIGS. 18 to 24 are views in section analogous to FIGS. 1 to 7 showing the preparation of the substrates from FIG. 17 and the fabrication of a mixed substrate therefrom.

Precise elimination is effected by monitoring the thickness to remove all (or practically all) of the thickness of oxide on top of the regions Z'2 (FIG. 11). This elimination may be effected by wet treatment with HF or by additional CMP treatment and/or hydrogen annealing and/or RIE. Localized layers 21A remain.

The whole of the surface is then cleaned by chemical treatment to render it hydrophilic.

This wafer is then bonded by molecular adhesion to another silicon wafer 22 having a native oxide (not shown) and whose surface is also hydrophilic. This second bonding is effected with a minimum misalignment between the two crystals, for example by orienting them by means of X-rays.

Here, this second wafer 22 has been implanted with hydrogen ions with an energy of 76 keV and a dosage of $5\times10^{16}$ at/cm² through an oxide layer 400 nm thick that is removed afterwards (FIG. 12), yielding a fragile layer 22A.

This is followed by annealing to cause fracture in the implanted region 22A and finally by annealing at 1300° C. for 3 hours to stabilize the bonding.

Figure 13:
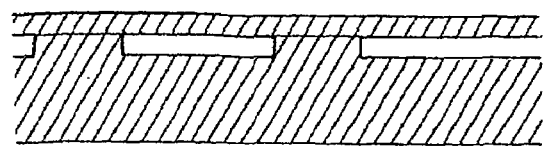

This is followed by polishing to obtain a mixed substrate including SOI regions delimited by the regions Z1' and "bulk" silicon/silicon contact regions delimited by the regions Z2' (FIG. 13).

Figure 14:
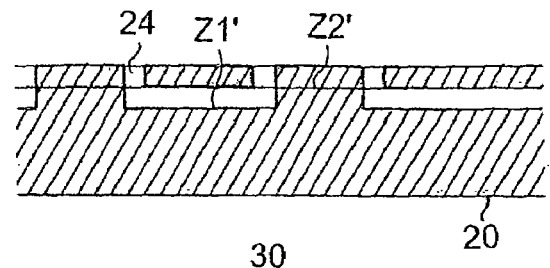

These regions may then be insulated from each other by trenches 24 (FIG. 14).

FIGS. 15 to 24 represent a third embodiment having analogies with the first embodiment.

The starting point is a first wafer 30 with the same composition and the same dimensions as the wafers 10 and 20. It is oxidized to form thereon an oxide layer 31 that is 400 nm thick and it is implanted with hydrogen ions having an energy of 76 keV at a dosage of $5 \times 10^{16}$ at/cm², forming a fragile layer 30A.

Figure 15:
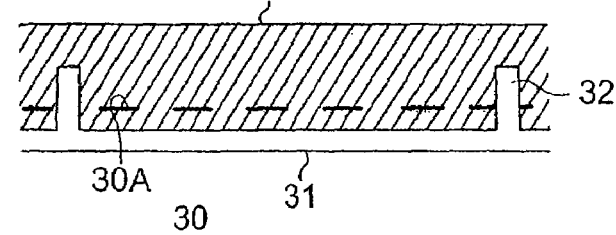

This wafer is then etched to produce graduated steps 32 consisting of rectangles 10 microns×2 microns, repeated every 1/100° over two 20° circular arcs positioned on a circle of 90 mm diameter (FIG. 15).

Figure 16:
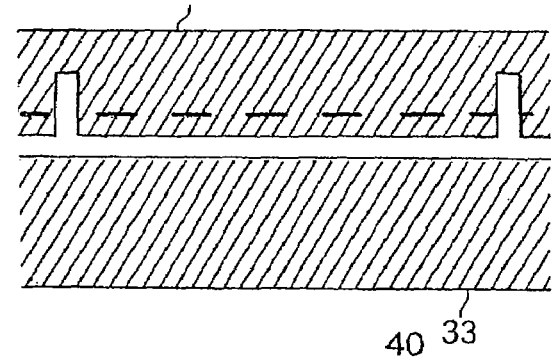

A second silicon wafer 33 with the same composition and the same dimensions as before is bonded by hydrophilic molecular adhesion to the first wafer 30 (FIG. 16).

Figure 17:
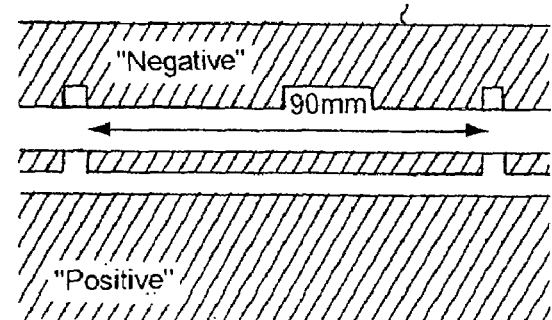
Figure 18:
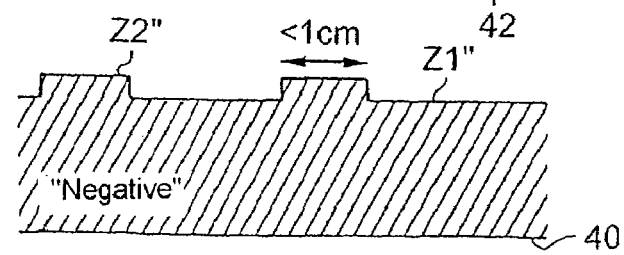
Figure 19:
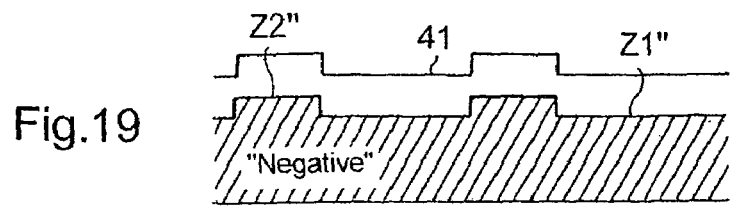
Figure 20:

Fracture in the implanted region is caused by mechanical and/or heat treatment of any appropriate type known in the art; two wafers 40 and 42 are obtained of which one, of SOI type, is referred to hereinafter as the "positive" wafer while the other is referred to as the "negative" wafer (FIG. 17).

Figure 21:
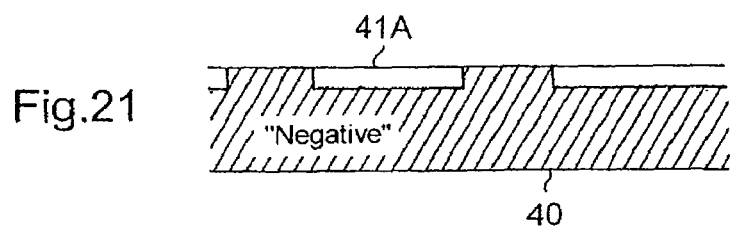

The wafer 40 is subjected to the same processing steps as the wafer 10 (FIGS. 18 to 21 correspond to FIGS. 1 to 4) with generation of an oxide layer 41 by deposition or by thermal oxidation, until a hydrophobic surface is obtained including localized oxide regions 41A (FIG. 21).

Figure 22:
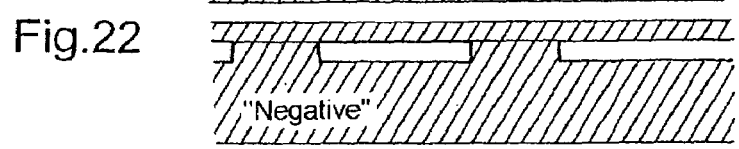

This wafer is then bonded by molecular adhesion to the positive wafer 42 which has no native oxide and whose surface is also hydrophobic (FIG. 22).

For example, during this bonding, the graduations of the two wafers may be aligned to eliminate completely rotation and bending misorientations between the two bonded crystals.

Taking the two wafers from the same starting wafer to form the future interface (at least in their thicknesses in the vicinity of this interface), and aligning them by means of marks produced before taking them from the starting wafer and dissociating them guarantees excellent alignment by all criteria, with the result that the minimum distance to obtain an interface of good quality is greatly increased.

Figure 23:
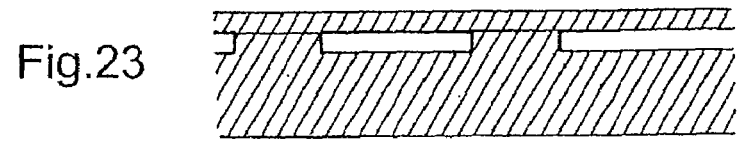
Figure 24:
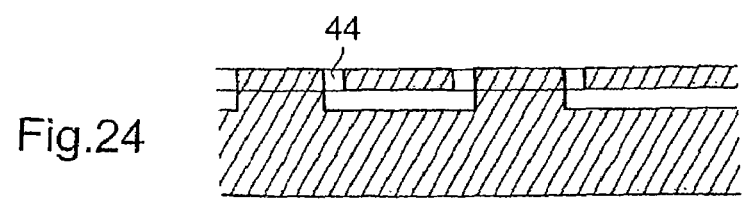

After stabilization annealing (at 1300° C. for 3 hours), the "positive" wafer 42 is thinned by mechanical and chemical abrasion using the buried oxide layer of the "positive" wafer 42 as the stop layer. This stop layer is then removed to obtain a mixed substrate including SOI regions delimited by the regions Z1" and silicon/silicon contact regions delimited by the regions Z2" (FIG. 23). These various regions may be insulated from each other by trenches 44 (FIG. 24).

It will be noted that the introduced trapping regions serve to "pump" the species enclosed at the interface, thereby enabling reconstruction of the bulk regions. In this example, this therefore avoids the problems inherent to transferring the silicon film onto a silicon substrate using hydrophobic bonding (e.g. by the so-called "Smart Cut"® process).

FIGS. 25 to 34 show a fourth embodiment having analogies with the second embodiment.

A first wafer 50 of the same kind and the same dimensions as the preceding wafers is oxidized to form an oxide layer 51 that is 400 nm thick and then implanted with hydrogen ions under the same conditions as in the third example, yielding a fragile layer 50A.

Figure 25:
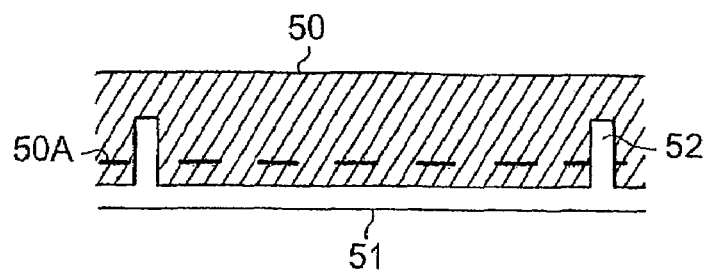
FIGS. 25 to 27 are views in section of the fabrication of two wafers intended for the fabrication of a mixed substrate of the type shown in FIGS. 12 to 14, and FIGS. 28 to 34 are views in section analogous to FIGS. 8 to 14 showing the preparation of the substrates from FIG. 27 and the fabrication of a mixed substrate therefrom.
Figure 26:
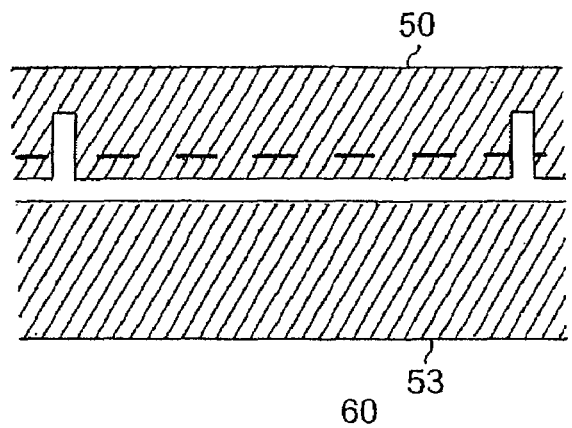

The same type of etching is then carried out as in this third embodiment to form steps 52 (FIG. 25).

Figure 27:
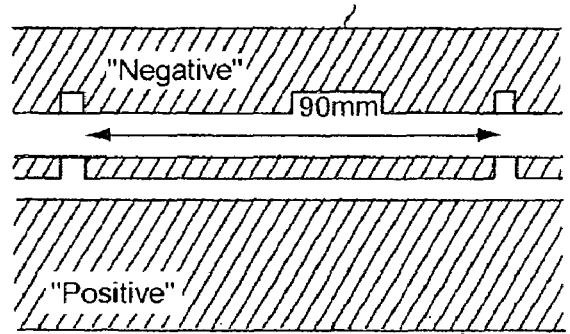
Figure 28:
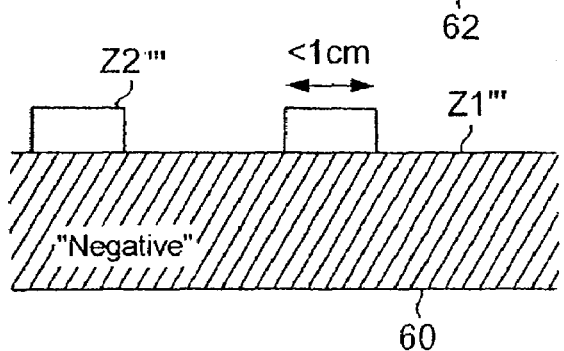

A second wafer 53 of the same kind and with the same dimensions as the preceding wafers is bonded by hydrophilic molecular adhesion to the first wafer (FIG. 26) and fracture is caused in the implanted region, as in this third embodiment, to obtain a so-called "negative" wafer 60 and a so-called "positive" wafer 62 (FIG. 27).

Figure 29:
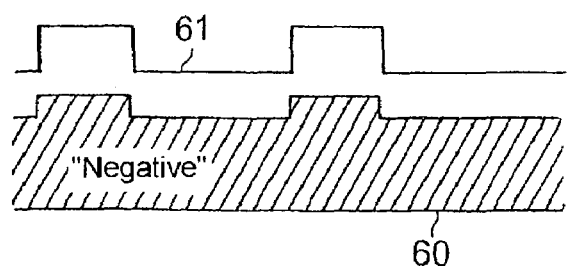
Figure 30:
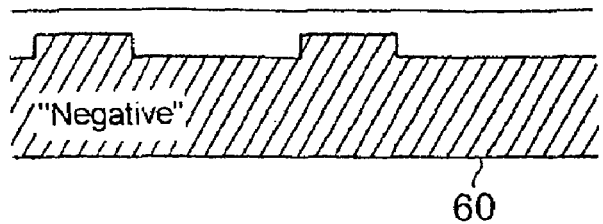
Figure 31:
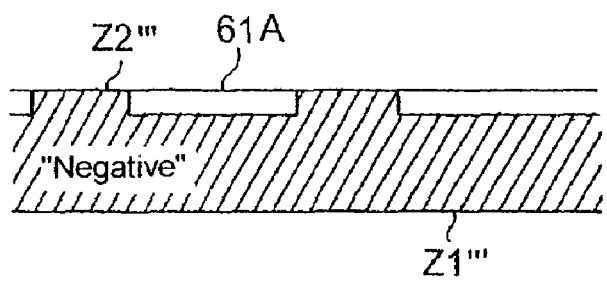

The "negative" wafer 60 is then oxidized over the whole of its surface, like the wafer 20 of the second embodiment, to form an oxide layer that is about 1 micron thick. This last wafer is then etched like the wafer 20 (FIG. 28) and a thermal oxide layer 61 that is 0.8 micron thick is deposited (FIG. 29). The same treatments are applied as are applied to the wafer 20 (FIGS. 28 to 34 are analogous to FIGS. 8 to 14), to render the surface hydrophilic, with localized oxide regions 61A.

This wafer is then bonded to the other, "positive", wafer 62, which has native oxide and whose surface is also hydrophilic.

Figure 32:
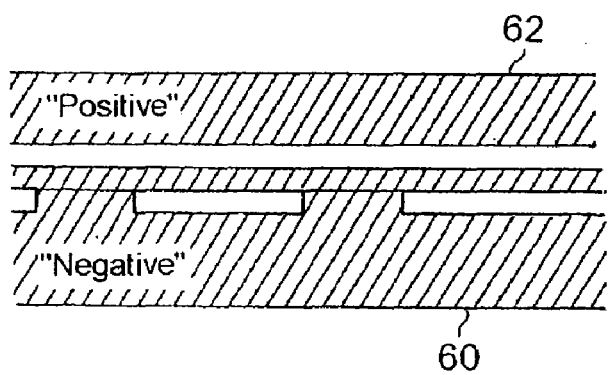
Figure 33:
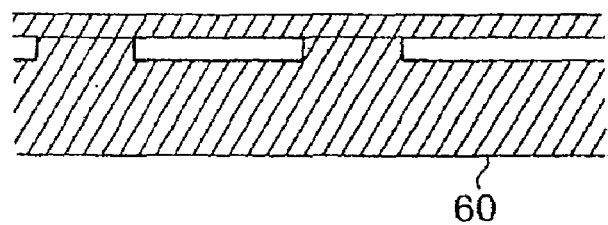
Figure 34:
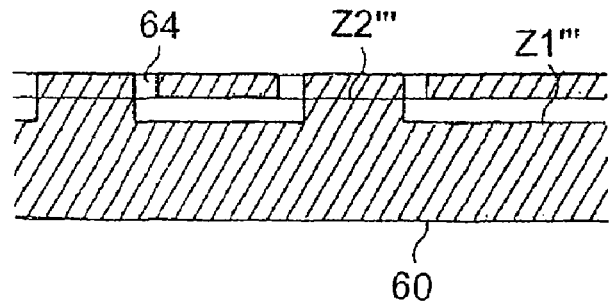

The second bonding is effected with the minimum misalignment between the two crystals by aligning the graduated steps, as in the third embodiment (FIG. 32).

This is followed by annealing to cause fracture in the implanted region and finally by stabilization annealing as in the third embodiment.

The "positive" wafer is then thinned.

After the stop layer is removed, there is obtained a mixed substrate including SOI regions delimited by the regions Z1''' and "bulk" regions delimited by the regions Z2''', which regions may then be insulated from each other by trenches 64.

To produce MEMS or MOEMS components, the buried layer of the non-bulk region may, instead of being insulative, simply consist of a material different from the material constituting the bulk region. In practice, the silicon/silicon oxide pair is often selected, but in this case the oxide is not used for its insulative character. In a manner analogous to the embodiments previously described, traps are provided at the interface to obtain in the bulk regions an interface of good quality (with a limited number of impurities).

The invention claimed is:

1. A method of fabricating a mixed substrate, the method comprising:
providing two substrates each having respective bonding faces adapted to be bonded together, the bonding faces having crystalline portions and, wherein at least one of the bonding faces, includes regions of a material different from the crystalline portions;
positioning the bonding faces and joining the bonding faces at an interface by molecular bonding to form bulk regions, in which the bonding faces are substantially crystalline, and stacked regions in which at least one of the bonding faces includes a region of the different material; and
heating to consolidate the bond,
wherein, during one of providing the two substrates or joining the bonding faces, impurity traps are created at the interface, such that any portion of the interface at a bulk region is within a predetermined distance from a trap, and wherein a misalignment between the crystalline portions when positioning the bonding faces is less than a predetermined misalignment threshold.

2. The method according to claim 1, wherein the regions of a different material comprise electrically insulative layers.

3. The method according to claim 1, wherein the regions of a different material comprise localized oxide layers.

4. The method according to claim 1, wherein the traps comprise localized buried layers.

5. The method according to claim 1, wherein the traps are localized oxide layers.

6. The method according to claim 1, wherein the regions of a different material have a thickness of approximately 0.01 microns to approximately 3 microns.

7. The method according to claim 1, wherein the regions of a different material comprise localized oxide layers prepared by thermal oxidation using a mask.

8. The method according to claim 1, wherein the regions of a different material comprise localized oxide layers prepared by deposition using a mask.

9. The method according to claim 1, wherein providing two substrates further includes a step of treating the bonding faces to render them hydrophobic.

10. A method according to claim 1, wherein the predetermined misalignment threshold is ±6° in rotation and ±1° in bending.

11. The method according to claim 1, wherein the method further comprises:
    etching one of the bonding faces to form a partially etched bonding face using a mask with pattern features that are laterally spaced apart by a distance of no more than the predetermined distance;
    generating an oxide layer on the partially etched bonding face;
    planarizing the one face to expose the non-etched regions; and
    cleaning the one face to render it hydrophobic.

12. The method according to claim 1, wherein providing two substrates includes a step of treating bonding faces to render them hydrophilic.

13. The method according to claim 1, wherein the predetermined misalignment threshold is ±1° in rotation and in bending.

14. The method according to claim 1, wherein the method further comprises forming an oxide layer on one of the bonding faces and etching the oxide layer and the underlying bonding face using a mask with pattern features that are laterally spaced apart by a distance to form a patterned surface of no more than the predetermined distance, and forming a thermal oxide layer on the patterned surface, and planarizing the patterned surface to expose non-etched regions of patterned surface, and cleaning the patterned surface to render it hydrophilic.

15. The method according to claim 1, wherein providing two substrates having crystalline portions comprises providing a material comprising one or more of Si, InP, AsGa, Ge, compounds of silicon, silicon-germanium, LiNbO3, III-V compounds, SiC, diamond, sapphire, piezoelectric materials, or pyroelectric materials.

16. The method according to claim 1, wherein providing two substrates having crystalline portions comprises providing silicon.

17. The method according to claim 1, wherein heating to consolidate the bond comprises carrying out a heat treatment up to 3 hours at a temperature from 800° C. to 1400° C., and wherein the predetermined distance is about one millimeter.

18. The method according to claim 1 further comprising treating the bonding faces with HF to remove oxides from the bonding faces prior to positioning the faces.

19. The method according to claim 1 further comprising heat treating the bonding faces prior to positioning the bonding faces.

20. The method according to claim 1 further comprising polishing the bonding faces by chemical mechanical polishing prior to positioning the bonding faces.

21. The method according to claim 1 further comprising plasma treating the bonding faces prior to positioning the bonding faces.

22. The method according to claim 1 further comprising chemically treating the bonding faces prior to positioning the bonding faces.

23. The method according to claim 1 further comprising applying a thinning treatment to one of the two substrates.

24. The method according to claim 1 further comprising thinning one of the substrates by a chemical mechanical abrasion treatment.

25. The method according to claim 1 further comprising preparing one of the substrates to form a demountable substrate and, wherein the method further comprises a subsequent step comprising demounting the demountable substrate.

26. The method according to claim 1, further comprising thinning one of the two substrates by producing a fragile layer in one of the two substrates and fracturing the fragile layer.

27. The method according to claim 1, wherein providing substrates having crystalline portions comprises providing two substrates prepared from the same crystal.

28. The method according to claim 1, wherein providing two substrates comprises preparing the substrates by producing a fragile layer in a source crystal, placing markers on either side of the fragile layer, and fracturing the fragile layer to create bonding faces, and wherein positioning the bonding faces comprises forming the interface with the stacked regions and the impurity traps by bringing the bonding faces into contact after lining up the markers.

29. The method according to claim 28, wherein producing the fragile layer comprises ion implantation.

30. The method according to claim 28, wherein producing the fragile layer comprises implanting hydrogen ions.

31. The method according to claim 28, wherein placing markers comprises forming the markers within the thickness of the source crystal and on either side of the fragile layer.

* * * * *

UNITED STATES PATENT AND TRADEMARK OFFICE
CERTIFICATE OF CORRECTION

PATENT NO.        : 7,494,897 B2                              Page 1 of 1
APPLICATION NO.   : 10/540303
DATED             : February 24, 2009
INVENTOR(S)       : Franck Fournel et al.

It is certified that error appears in the above-identified patent and that said Letters Patent is hereby corrected as shown below:

In the Claims:

Column 13, claim 11, line 30, after "planarizing the" delete "one" and substitute -- partially etched bonding -- in its place.

Column 14, claim 18, line 10, after "positioning the" insert -- bonding --.

Signed and Sealed this

Tenth Day of August, 2010

David J. Kappos
*Director of the United States Patent and Trademark Office*